(12) United States Patent
Benavides et al.

(10) Patent No.: US 6,786,760 B1
(45) Date of Patent: Sep. 7, 2004

(54) METHOD AND SYSTEM FOR SENSING IC PACKAGE ORIENTATION IN SOCKETS

(75) Inventors: John A. Benavides, Garland, TX (US); Richard W. Adkisson, Dallas, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 10/420,577

(22) Filed: Apr. 21, 2003

(51) Int. Cl.[7] .............................................. H01R 3/00
(52) U.S. Cl. .................................................. 439/490
(58) Field of Search ............................... 439/490, 489, 439/486, 620

(56) References Cited

U.S. PATENT DOCUMENTS

| | | | | |
|---|---|---|---|---|
| 4,872,844 A | * | 10/1989 | Grebe et al. .................. | 439/69 |
| 5,067,911 A | * | 11/1991 | Saeki ........................... | 439/526 |
| 6,120,318 A | * | 9/2000 | Reed et al. ................... | 439/490 |
| 6,325,664 B1 | * | 12/2001 | Someda et al. ............... | 439/490 |
| 6,439,922 B1 | * | 8/2002 | Laurer et al. ................. | 439/490 |
| 6,655,988 B1 | * | 12/2003 | Simmons et al. ............. | 439/541.5 |

* cited by examiner

*Primary Examiner*—Chandrika Prasad
(74) *Attorney, Agent, or Firm*—John Pessetto

(57) ABSTRACT

An embodiment of this invention provides a system and method for indicating the orientation of a packaged IC in a socket. An LED is physically mounted to a socket. One lead of the LED is electrically connected to a positive voltage through a socket hole on the socket. When the orientation of the IC package in the socket is correct, the other lead of the LED is connected to a ground path on the packaged IC. As a result, the LED is activated indicating the orientation of the packaged IC is correct.

17 Claims, 12 Drawing Sheets

METHOD AND SYSTEM FOR SENSING IC PACKAGE ORIENTATION IN SOCKETS

FIELD OF THE INVENTION

This invention relates generally to packaged integrated electronic circuits. More particularly, this invention relates to sensing the orientation of a packaged IC in a socket.

BACKGROUND OF THE INVENTION

Very Large Scale Integrated (VLSI) chips may contain millions of transistors and electrical connections. Because VLSI chips may be so complex, a great deal of testing may be required to verify that a particular chip is fully functional. The time required to test an integrated circuit (IC) may increase the cost of an IC. As a result, it is desirable to reduce the time required to test an IC.

ICs are typically manufactured on a silicon wafer. Each silicon wafer may contain dozens of individual ICs. These ICs may be microprocessors, DRAMs (Dynamic Random Access Memory), SRAMs (Static Random Access Memory), or other types of ICs. The individual ICs on a silicon wafer are usually tested before the wafer is cut into separate, individual ICs. After all the ICs on the wafer are tested, the wafer is cut into separate, individual ICs and the ICs that passed the tests during wafer test are packaged.

Next, packaged ICs are tested. Packaged ICs are usually placed in a socket that is connected to external test equipment. The external test equipment applies power and signals to operate and test packaged ICs. The tests applied by test equipment can be very complex and as a result may require a relatively great deal of time to complete testing. Before applying the complete suite of tests found on external test equipment, it would be helpful to know if the packaged IC is correctly oriented in a test socket.

The orientation of a packaged IC may be difficult to detect, for example, because the module may be symmetrical about both the X and Y axis. As a result the packaged IC may be incorrectly placed in a socket. If a packaged IC is incorrectly placed in a socket during testing of the packaged IC, the tests may fail and a great deal of time and effort may be used before it is discovered the packaged IC is incorrectly oriented in the socket.

In addition, when a packaged IC is incorrectly oriented in a socket that is part of a system, for example, a computer, the system may not operate properly. Again, a great deal of time and effort may be used in this situation before the incorrect orientation is detected.

There is a need in the art to communicate the orientation of a packaged IC in a socket. One embodiment of this invention communicates the orientation of a packaged IC in a socket by activating an LED mounted to the socket when the orientation of the packaged IC is incorrect. A detailed description of this embodiment of this invention is described later.

SUMMARY OF THE INVENTION

An embodiment of this invention provides a system and method for indicating the orientation of a packaged IC in a socket. An LED is physically mounted to a socket. One lead of the LED is electrically connected to a positive voltage through a socket hole on the socket. When the orientation of the IC package in the socket is correct, the other lead of the LED is connected to a ground path on the packaged IC. As a result, the LED is activated indicating the orientation of the packaged IC is correct.

Other aspects and advantages of the present invention will become apparent from the following detailed description, taken in conjunction with the accompanying drawing, illustrating by way of example the principles of the invention.

DETAILED DESCRIPTION OF THE PREFERRED EMBODIMENT

Figure 1:
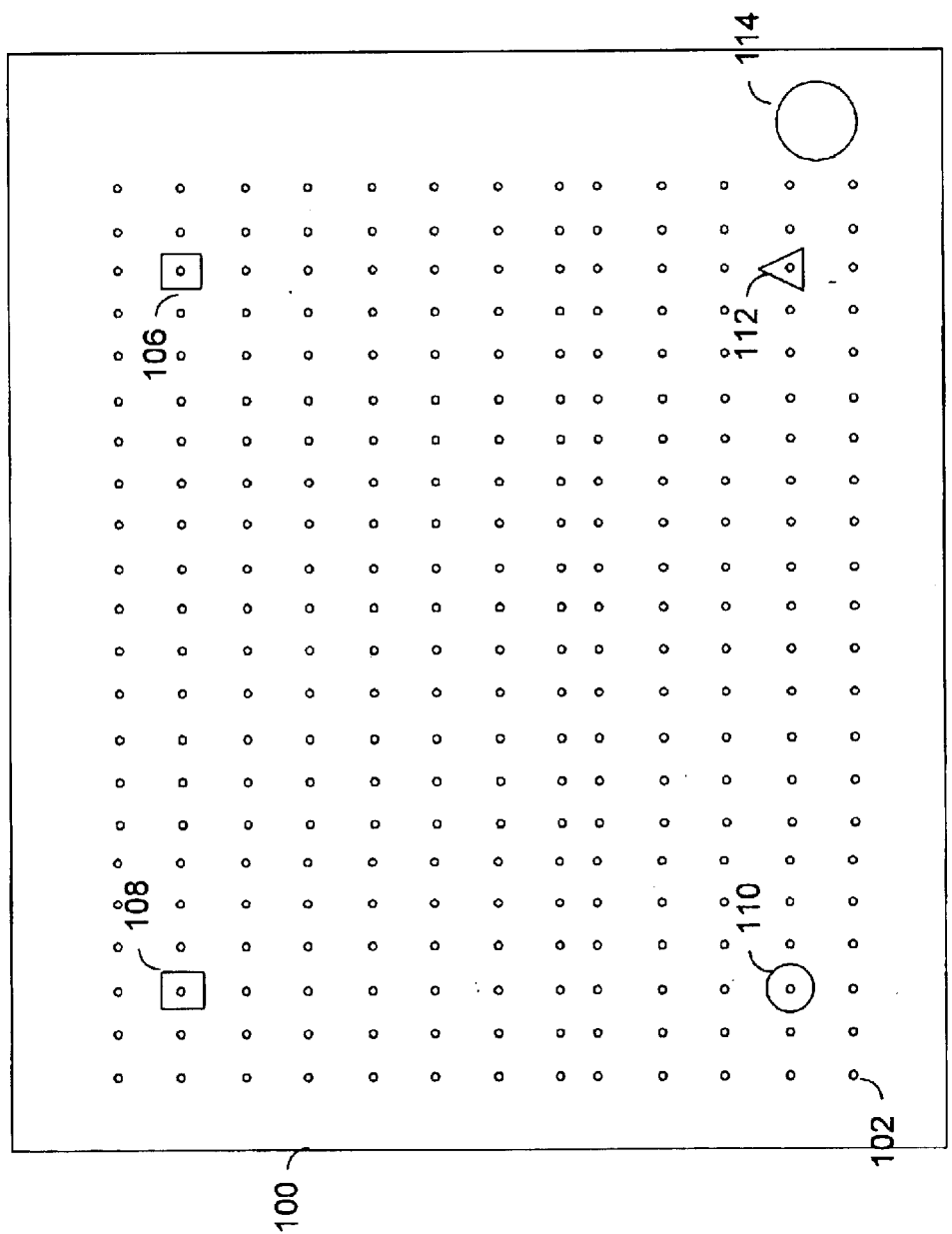
FIG. 1 is a mechanical drawing of a socket and light source viewed from the top.

FIG. 1 is a mechanical drawing of a socket, 100 and light source, 114, viewed from the top. Socket holes, which provide connections for IC contacts (e.g. pins, BGA balls, or other electrical or optical contacts), 102, are represented by small circles in FIG. 1. In this embodiment, the light source, 114 is physically mounted to the top of the socket, 100. The light source is electrically connected to a positive voltage and to socket hole 112. Socket hole 110 is connected to a ground. When a packaged IC is correctly oriented in the socket, 100, the packaged IC provides a ground path from socket hole 112 to socket hole 110. Providing a ground path from socket hole 112 to socket hole 110 allows current to be conducted through light source, 114, activating the light source. An activated light source, in this example, indicates the packaged IC is oriented correctly. Socket holes, 106 and 108, are not connected to a ground or any reference voltage.

Figure 2:
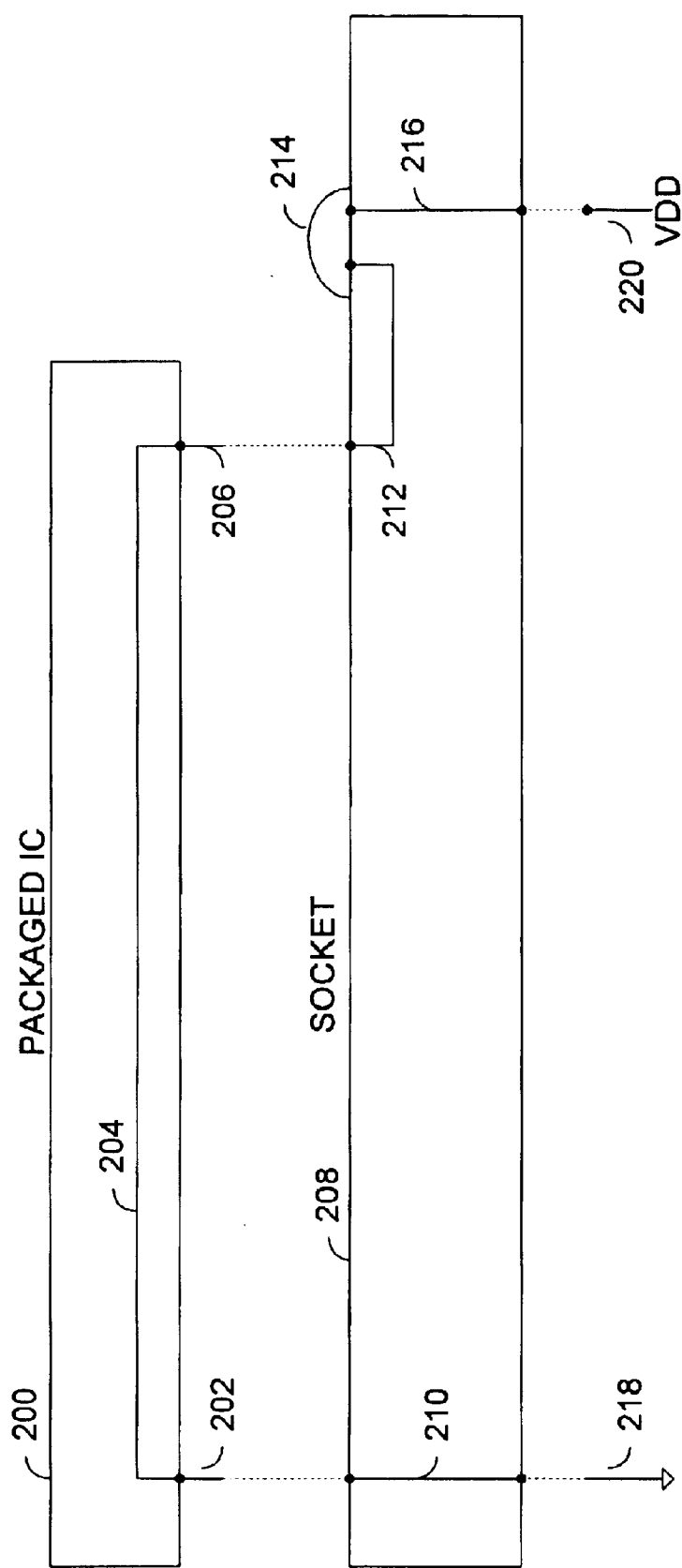
FIG. 2 is a mechanical drawing of a socket, a light source, and a packaged IC viewed from the side.

FIG. 2 is a mechanical drawing of a socket, 208, a light source, 214, and a packaged IC, 200, viewed from the side. In this embodiment, the light source, 214, is physically mounted to the top of the socket, 208. The light source, 214, is electrically connected, 216, to a positive voltage, 220 and to socket hole 212. Socket hole, 210, provides a path to a ground, 218

In this example, packaged IC, 200, is correctly oriented in socket 208 when pin 202 is inserted in socket hole 210, and pin 206 is inserted in socket hole 212. When pin 202 is inserted in socket hole 210, and pin 206 is inserted in socket hole 212, a ground path, 204, is provided by the packaged IC, 200, from socket hole 212 to ground, 218. Providing a ground path, 204, from socket hole 212 to ground, 218, allows current to be conducted through light source, 214, activating the light source, 214. An activated light source, 214, in this example, indicates the packaged IC, 200, is oriented correctly.

Figure 3:
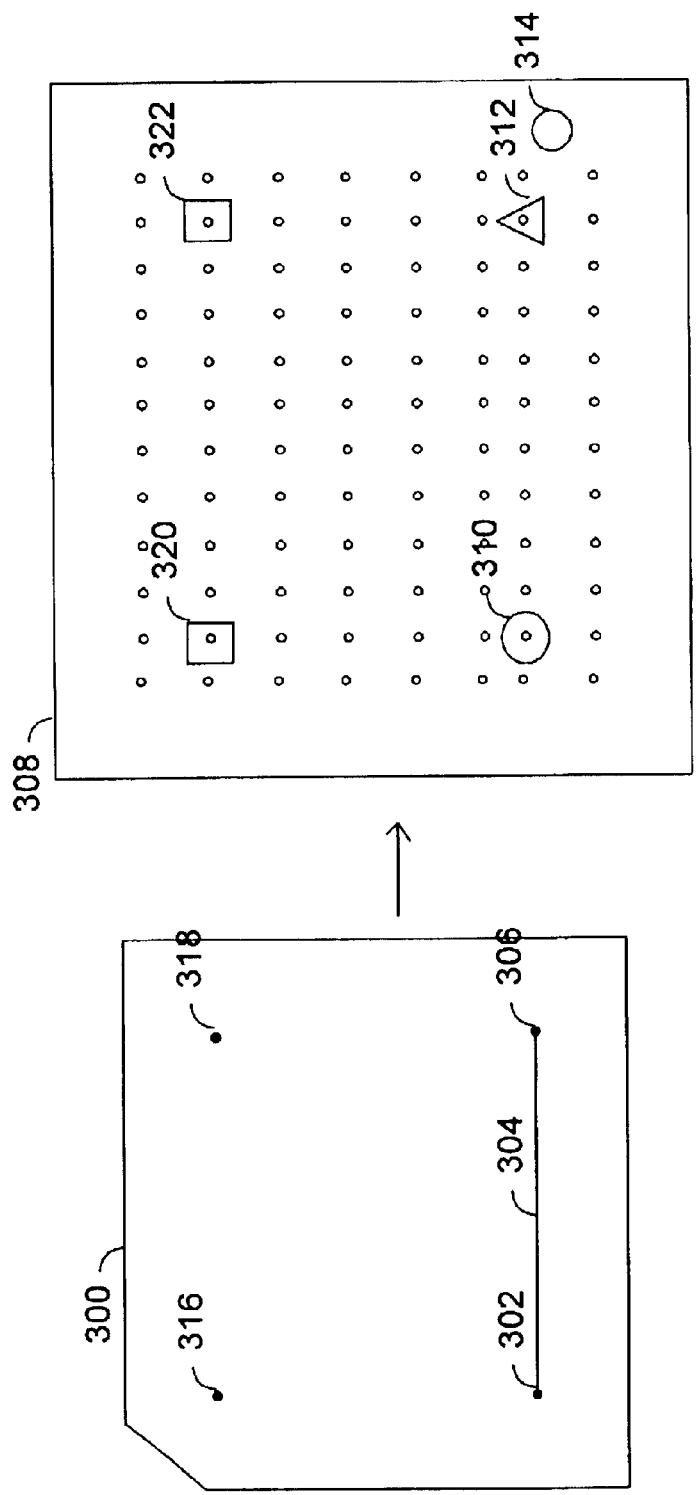
FIG. 3 is a mechanical drawing of a socket, a light source, and a packaged IC viewed from the top.

FIG. 3 is a mechanical drawing of a socket, 308, a light source, 314, and a packaged IC, 300, viewed from the top. In this embodiment, the light source, 314, is physically mounted to the top of the socket, 308. Socket hole 312 is electrically connected to one lead of light source 314 and a positive voltage is electrically connected to the other lead of light source 314. Socket hole, 310, is this example, is connected to an external ground. Socket holes 320 and 322 are not connected to a ground or a reference voltage.

Pin 302 is electrically connected through ground path, 304, to pin 306.

Pins 316 and 318 on packaged IC 300 are not connected to a ground or a voltage reference. To correctly insert packaged IC, 300, into, socket 308, pin 302 is inserted in to socket hole 310, pin 306 is inserted into socket hole 312, pin 316 is inserted into socket hole 320, and pin 318 is inserted into socket hole 322. When packaged IC 300 is correctly inserted into socket 308, a ground path, 304, is provided from socket hole 312 to socket hole 310. In this example, socket hole 310 is connected to an external ground. Providing a ground path, 304, from socket hole 312 to grounded socket hole, 310, allows current to be conducted through light source, 314, activating the light source, 314. An activated light source, 314, in this example, indicates the packaged IC, 300, is oriented correctly.

Figure 4:
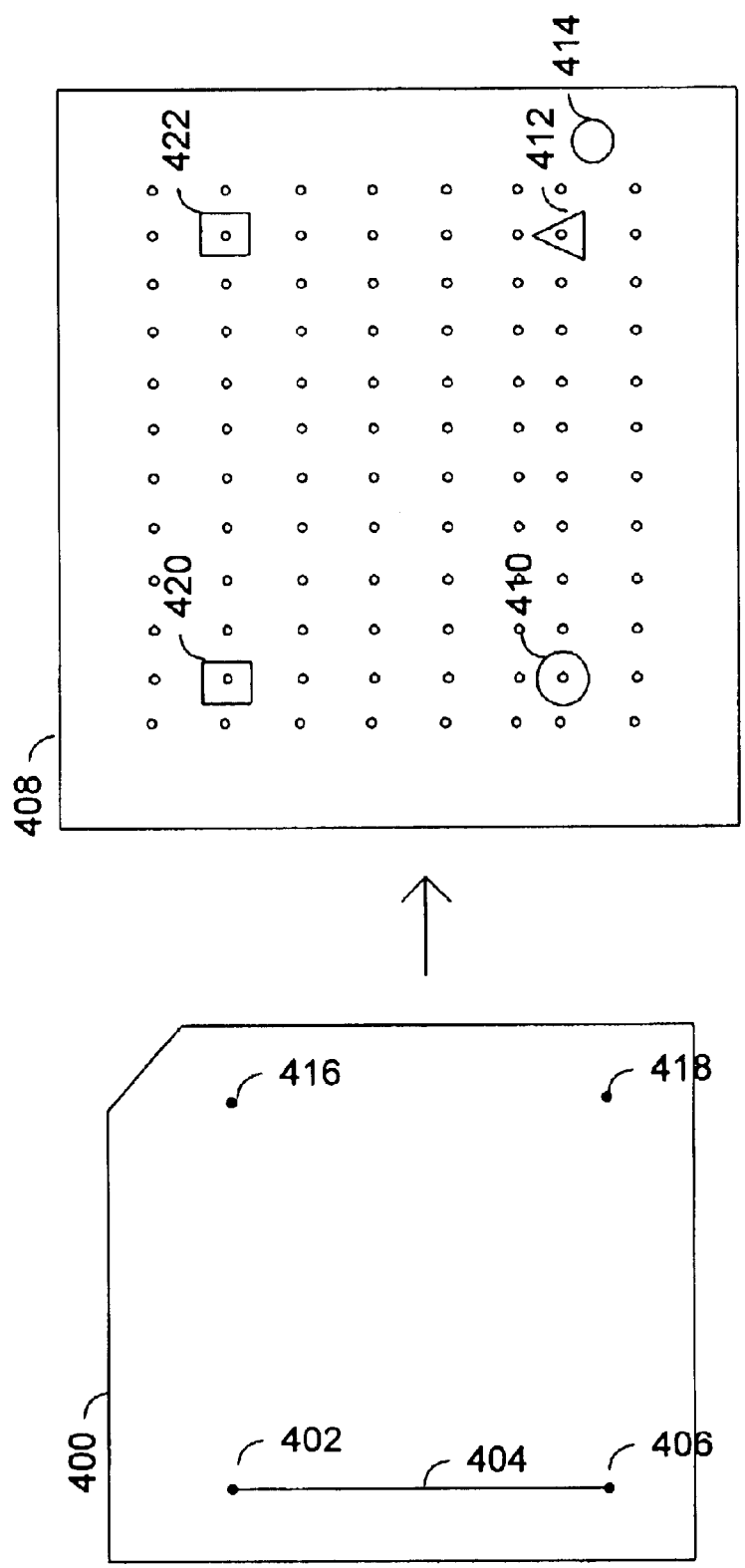
FIG. 4 is a mechanical drawing of a socket, a light source, and a packaged IC viewed from the top.

FIG. 4 is a mechanical drawing of a socket, 408, a light source, 414, and a packaged IC, 400, viewed from the top. In this embodiment, the light source, 414, is physically mounted to the top of the socket, 408. Socket hole 412 is electrically connected to one lead of light source 414 and a positive voltage is electrically connected to the other lead of light source 414. Socket hole, 410, is this example, is connected to an external ground. Socket holes 420 and 422 are not connected to a ground or a reference voltage.

Pin 402 is electrically connected through ground path 404 to pin 406. Pins 416 and 418 on packaged IC 400 are not connected to a ground or a voltage reference. In this example, packaged IC, 400 is incorrectly inserted into socket 408, when pin 402 is inserted in to socket hole 420, pin 406 is inserted into socket hole 410, pin 416 is inserted into socket hole 422, and pin 418 is inserted into socket hole 412. In this example, when packaged IC 400 is incorrectly inserted into socket 408, no ground path is provided from socket hole 412 to socket hole 410. An inactivated light source, 414, in this example, indicates the packaged IC, 400, is oriented incorrectly.

Figure 5:
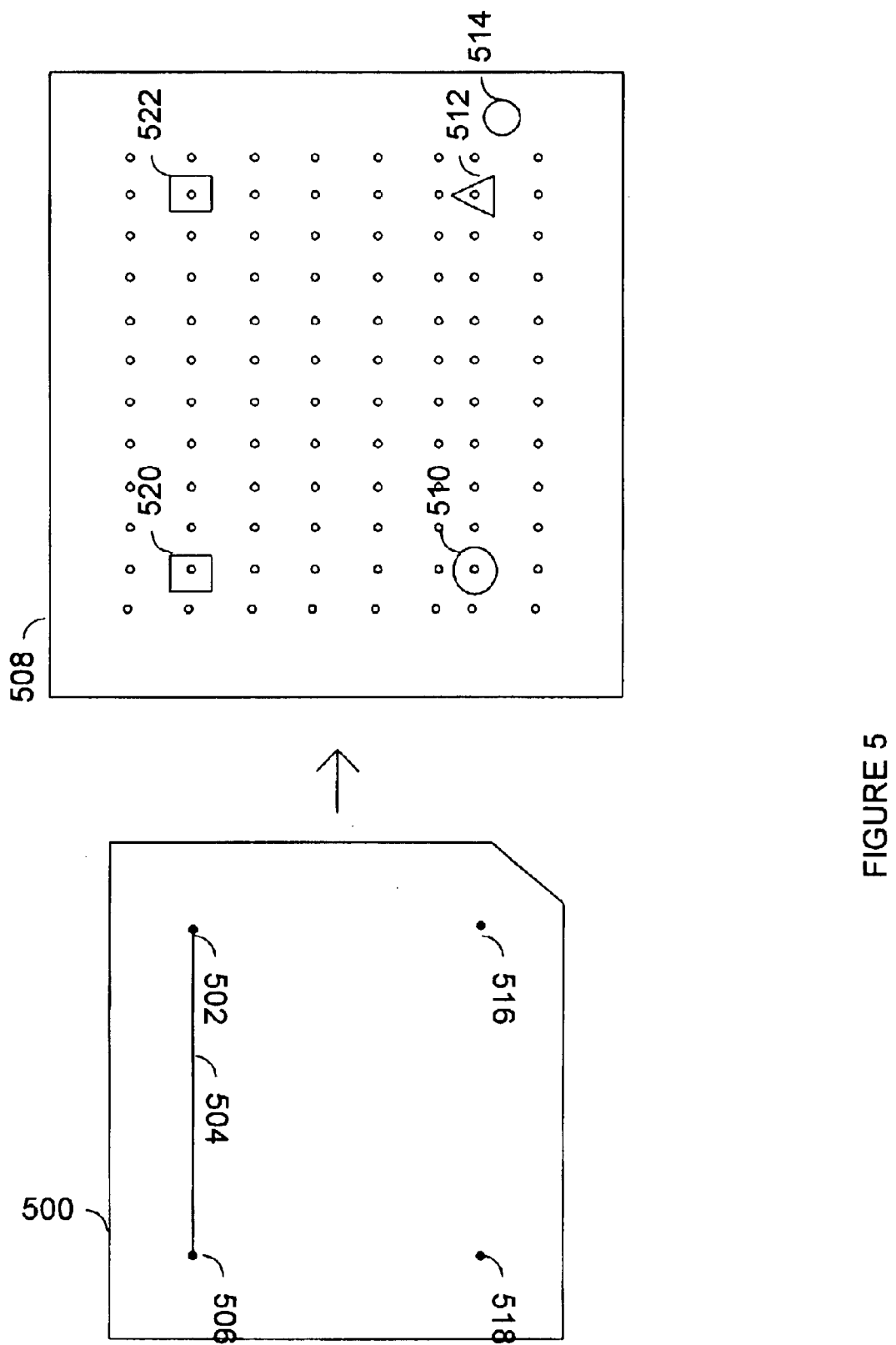
FIG. 5 is a mechanical drawing of a socket, a light source, and a packaged IC viewed from the top.

FIG. 5 is a mechanical drawing of a socket, 508, a light source, 514, and a packaged IC, 500, viewed from the top. In this embodiment, the light source, 514, is physically mounted to the top of the socket, 508. Socket hole 512 is electrically connected to one lead of light source 514 and a positive voltage is electrically connected to the other lead of light source 514. Socket hole, 510, is this example, is connected to an external ground. Socket holes 520 and 522 are not connected to a ground or a reference voltage.

Pin 502 is electrically connected through ground path 504 to pin 506. Pins 516 and 518 on packaged IC 500 are not connected to a ground or a voltage reference. In this example, packaged IC, 500 is incorrectly inserted into socket 508, when pin 502 is inserted in to socket hole 522, pin 506 is inserted into socket hole 520, pin 516 is inserted into socket hole 512, and pin 518 is inserted into socket hole 510. In this example, when packaged IC 500 is incorrectly inserted into socket 508, no ground path is provided from socket hole 512 to socket hole 510. An inactivated light source, 514, in this example, indicates the packaged IC, 500, is oriented incorrectly.

Figure 6:
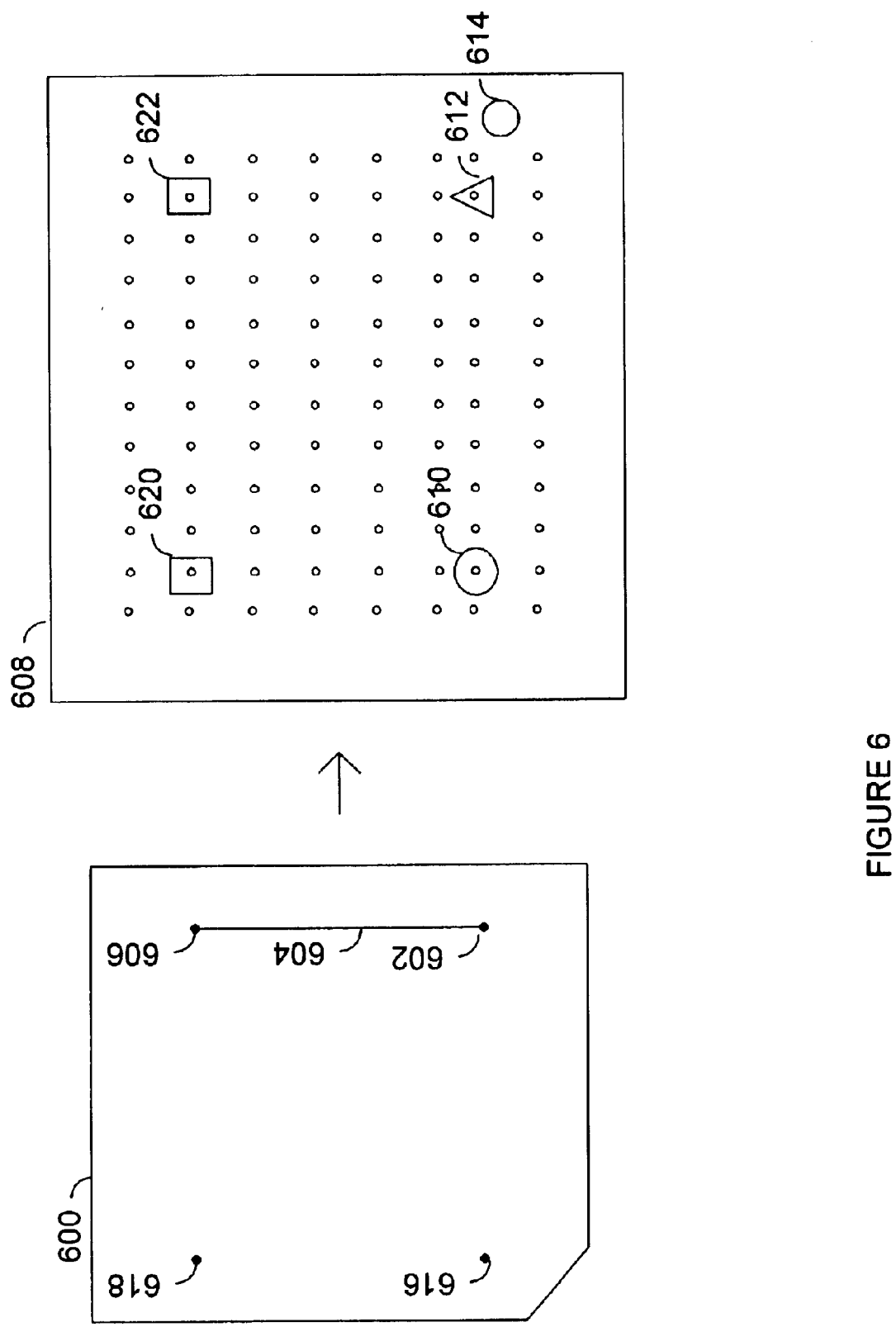
FIG. 6 is a mechanical drawing of a socket, a light source, and a packaged IC viewed from the top.

FIG. 6 is a mechanical drawing of a socket, 608, a light source, 614, and a packaged IC, 600, viewed from the top. In this embodiment, the light source, 614, is physically mounted to the top of the socket, 608. Socket hole 612 is electrically connected to one lead of light source 614 and a positive voltage is electrically connected to the other lead of light source 614. Socket hole, 610, is this example, is connected to an external ground. Socket holes 620 and 622 are not connected to a ground or a reference voltage.

Pin 602 is electrically connected through ground path 604 to pin 606.

Pins 616 and 618 on packaged IC 600 are not connected to a ground or a voltage reference. In this example, packaged IC, 600 is incorrectly inserted into socket 608, when pin 602 is inserted in to socket hole 612, pin 606 is inserted into socket hole 622, pin 616 is inserted into socket hole 610, and pin 618 is inserted into socket hole 620. In this example, when packaged IC 600 is incorrectly inserted into socket 608, no ground path is provided from socket hole 612 to socket hole 610. An inactivated light source, 614, in this example, indicates the packaged IC, 600, is oriented incorrectly.

Figure 7:
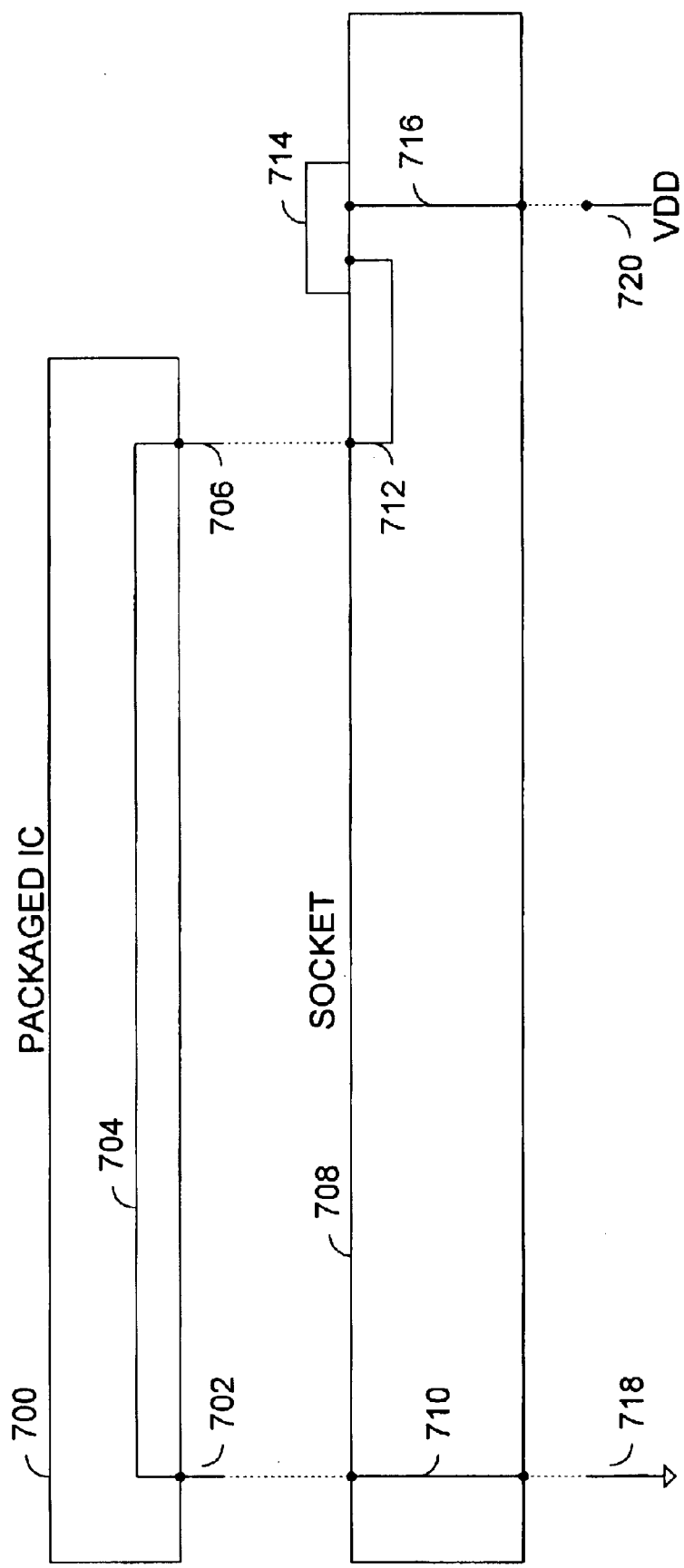
FIG. 7 is a mechanical drawing of a socket, an audio source, and a packaged IC viewed from the side.

FIG. 7 is a mechanical drawing of a socket 708, an audio source, 714, and a packaged IC, 700, viewed from the side. In this embodiment, the audio source, 714, is physically mounted to the top of the socket, 708. The audio source, 714, is electrically connected, 716, to a positive voltage, 720 and to socket hole 712. Socket hole, 710, provides a path to a ground, 718.

In this example, packaged IC, 700, is correctly oriented in socket 708 when pin 702 is inserted in socket hole 710, and pin 706 is inserted in socket hole 712. When pin 702 is inserted in socket hole 710, and pin 706 is inserted in socket hole 712, a ground path, 704, is provided by the packaged IC, 700, from socket hole 712 to ground, 718. Providing a ground path, 704, from socket hole 712 to ground, 718, allows current to be conducted through the audio source, 714, activating the audio source, 714. An activated audio source, 714, in this example, indicates the packaged IC, 700, is oriented correctly.

Figure 8:
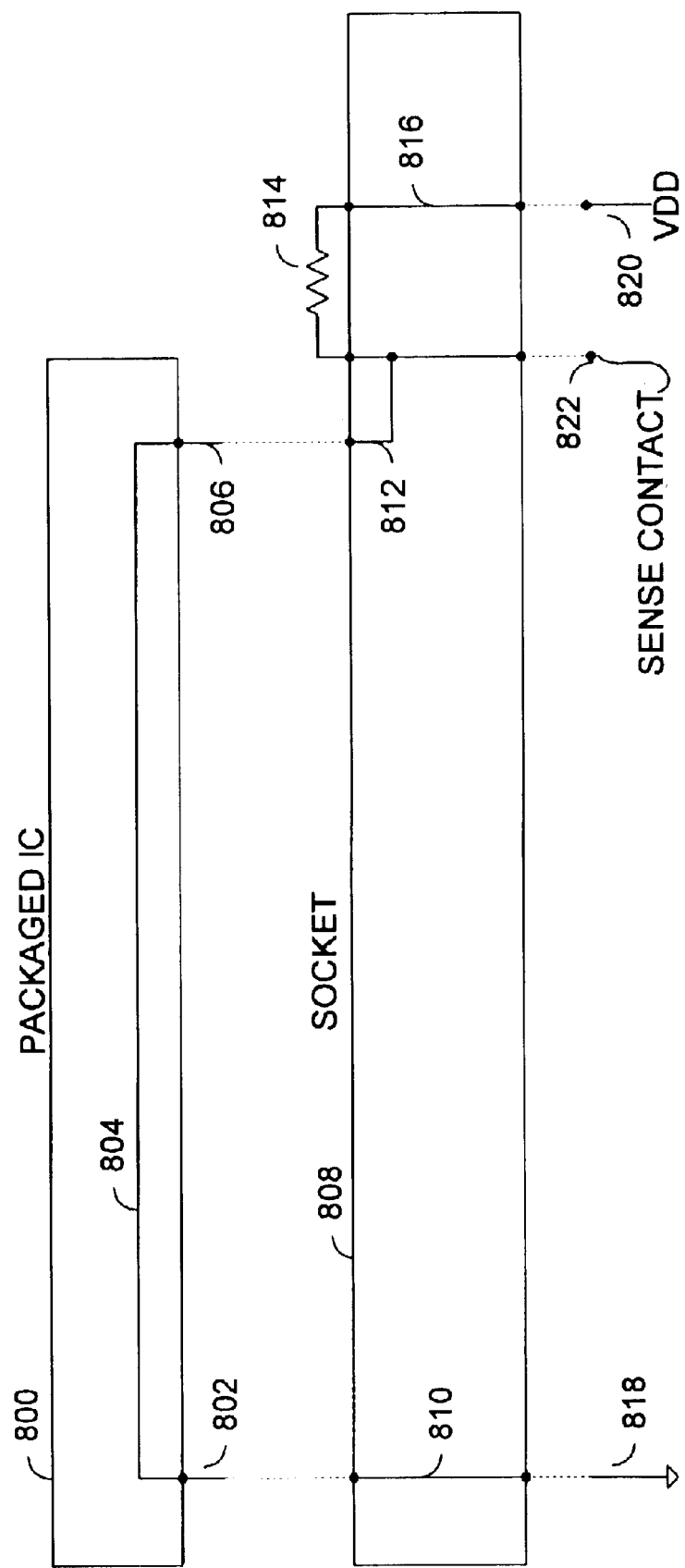
FIG. 8 is a mechanical drawing of a socket, a resistor, and a packaged IC viewed from the side.

FIG. 8 is a mechanical drawing of a socket, 808, a resistor, 814, and a packaged IC, 800, viewed from the side. In this embodiment, the resistor, 814, is physically mounted to the top of the socket, 808. The resistor, 814, is electrically connected, 816, to a positive voltage, 820, sense contact, 822, and to socket hole 812. Socket hole, 810, provides a path to a ground, 818.

In this example, packaged IC, 800, is correctly oriented in socket 808 when pin 802 is inserted in socket hole 810, and pin 806 is inserted in socket hole 812. When pin 802 is inserted in socket hole 810, and pin 806 is inserted in socket hole 812, a ground path, 804, is provided by the packaged IC, 800, from socket hole 812 to ground, 818. Providing a ground path, 804, from socket hole 812 to ground, 818, allows current to be conducted through the resistor, 814, which establishes a voltage on sense contact 822. The voltage on the sense contact, 822, may be used to drive external equipment. A voltage near ground on sense contact, 822, indicates the packaged is oriented correctly.

Figure 9:
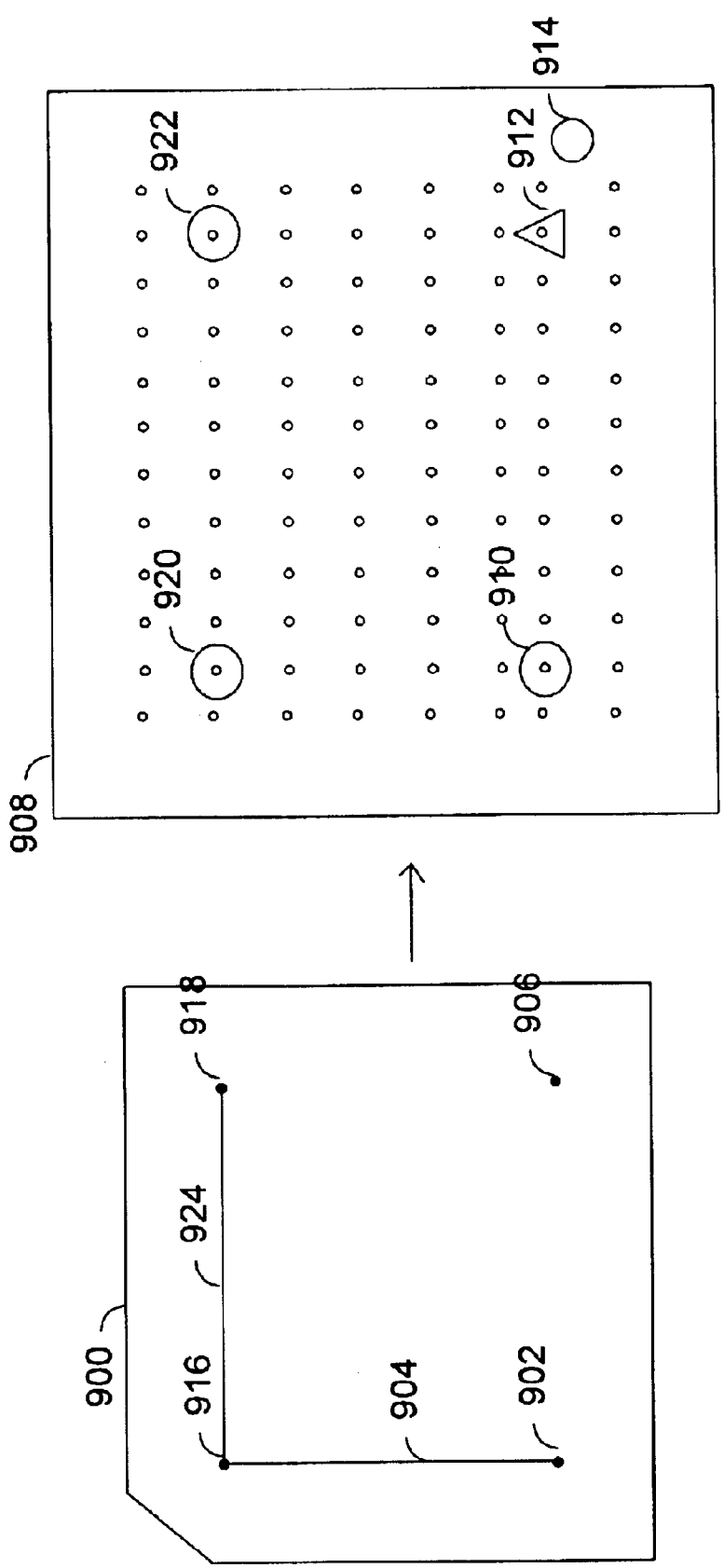
FIG. 9 is a mechanical drawing of a socket, a light source, and a packaged IC viewed from the top.

FIG. 9 is a mechanical drawing of a socket, 908, a light source, 914, and a packaged IC, 900, viewed from the top. In this embodiment, the light source, 914, is physically mounted to the top of the socket, 908, Socket hole 912 is electrically connected to one lead of light source 914 and a positive voltage is electrically connected to the other lead of light source 914. Socket holes, 910, 920, and 922 in this example, are connected to an external ground.

Pin 902 is electrically connected through ground path 904, to pin 916 and pin 916 is electrically connected through ground path 924 to pin 918. Pin 906 on packaged IC 900 is not connected to a ground or a voltage reference. To correctly insert packaged IC, 900, into, socket 908, pin 902 is inserted in to socket hole 910, pin 906 is inserted into socket hole 912, pin 916 is inserted into socket hole 920, and pin 918 is inserted into socket hole 922. When packaged IC 900 is correctly inserted into socket 908, no ground path is provided from socket hole 912. An inactivated light source, 914, in this example, indicates the packaged IC, 900, is oriented correctly.

Figure 10:
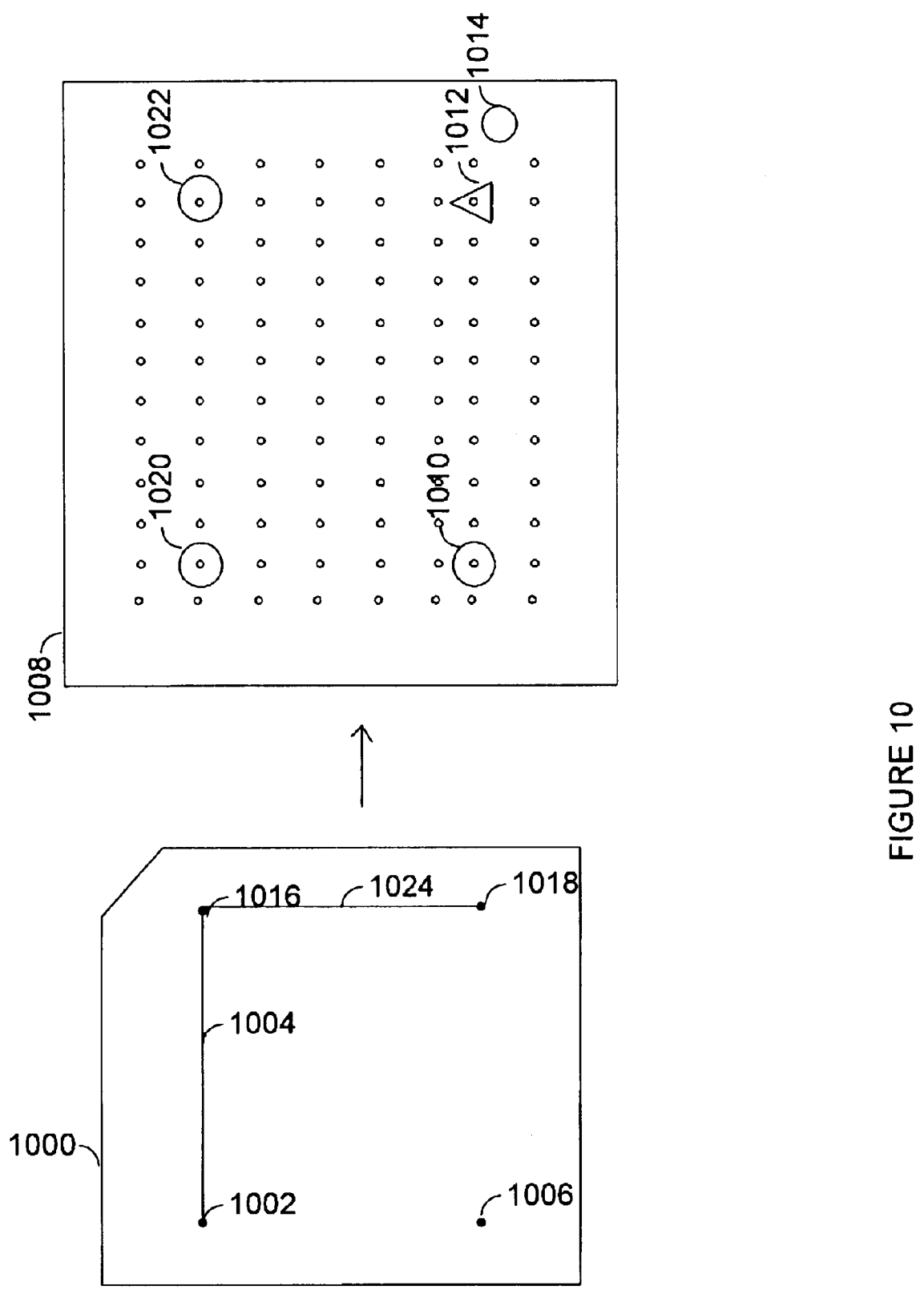
FIG. 10 is a mechanical drawing of a socket, a light source, and a packaged IC viewed from the top.

FIG. 10 is a mechanical drawing of a socket, 1008, a light source, 1014, and a packaged IC, 1000, viewed from the top. In this embodiment, the light source, 1014, is physically mounted to the top of the socket, 1008. Socket hole 1012 is electrically connected to one lead of light source 1014 and a positive voltage is electrically connected to the other lead of light source 1014. Socket holes, 1010, 1020, and 1022 in this example, are connected to an external ground.

Pin 1002 is electrically connected through ground path 1004 to pin 1016 and pin 1016 is electrically connected through ground path 1024 to pin 1018. Pin 1006 on packaged IC 1000 is not connected to a ground or a voltage reference. When packaged IC 1000 is incorrectly inserted into socket 1008, in this example, pin 1006 is inserted in to socket hole 1010, pin 1018 is inserted into socket hole 1012, pin 1002 is inserted into socket hole 1020, and pin 1016 is inserted into socket hole 1022. When packaged IC 1000 is incorrectly inserted into socket 1008, in this example, a ground path is provided from socket hole 1012 to a ground. An activated light source, 1014, in this example, indicates the packaged IC, 1000, is oriented incorrectly.

Figure 11:
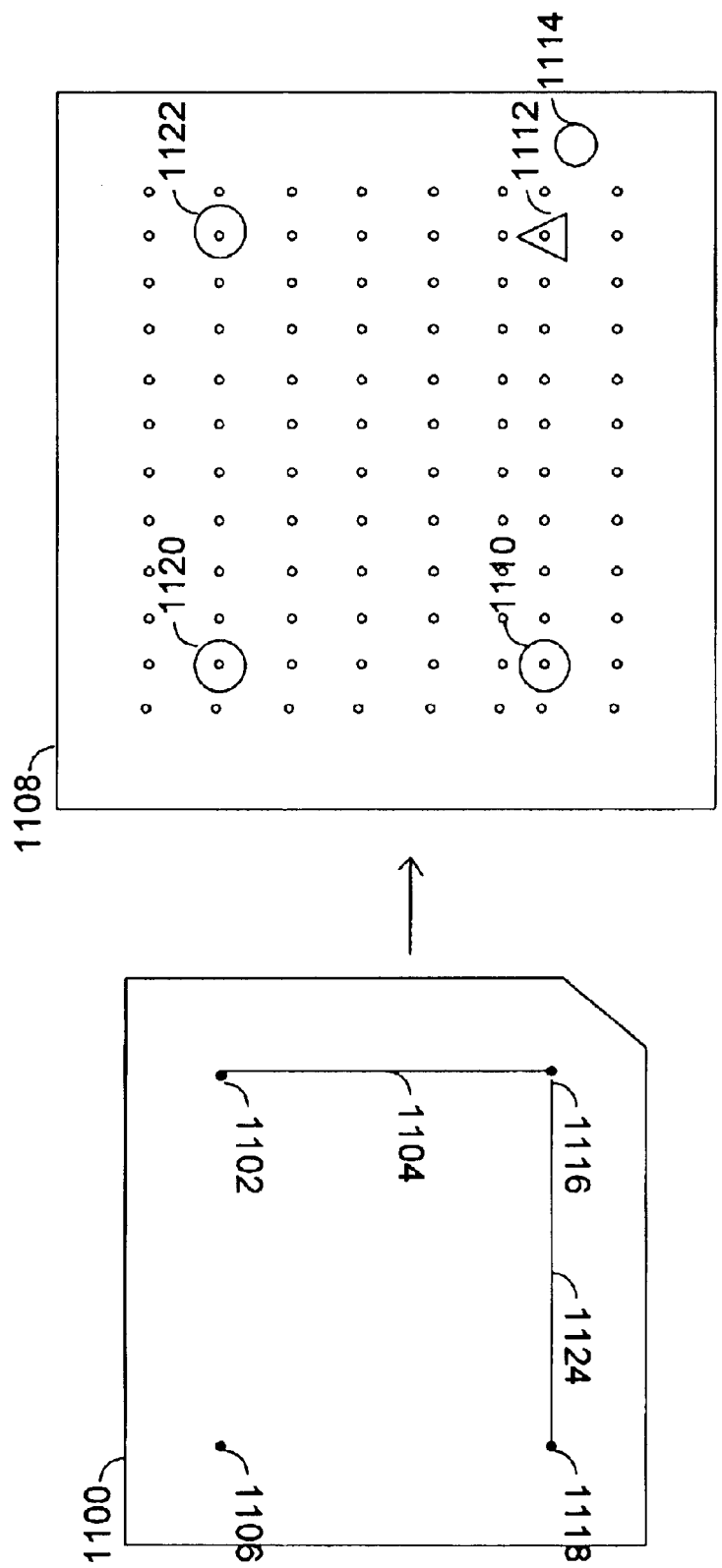
FIG. 11 is a mechanical drawing of a socket, a light source and a packaged IC viewed from the top.

FIG. 11 is a mechanical drawing of a socket, 1108, a light source, 1114, and a packaged IC, 1100, viewed from the top. In this embodiment, the light source, 1114, is physically mounted to the top of the socket, 1108. Socket hole 1112 is electrically connected to one lead of light source 1114 and a positive voltage is electrically connected to the other lead of light source 1114. Socket holes, 1110, 1120, and 1122, in this example, are connected to an external ground.

Pin 1102 is electrically connected through ground path 1104 to pin 1116 and pin 1116 is electrically connected through ground path 1124 to pin 1118. Pin 1106 on packaged IC 1100 is not connected to a ground or a voltage reference. When packaged IC 1100 is incorrectly inserted into socket 1108, in this example, pin 1118 is inserted in to socket hole 1110, pin 1116 is inserted into socket hole 1112, pin 1106 is inserted into socket hole 1120, and pin 1102 is inserted into socket hole 1122. When packaged IC 1100 is incorrectly inserted into socket 1108, in this example, a ground path is provided from socket hole 1112 to a ground. An activated light source, 1114, in this example, indicates the packaged IC, 1100, is oriented incorrectly.

Figure 12:
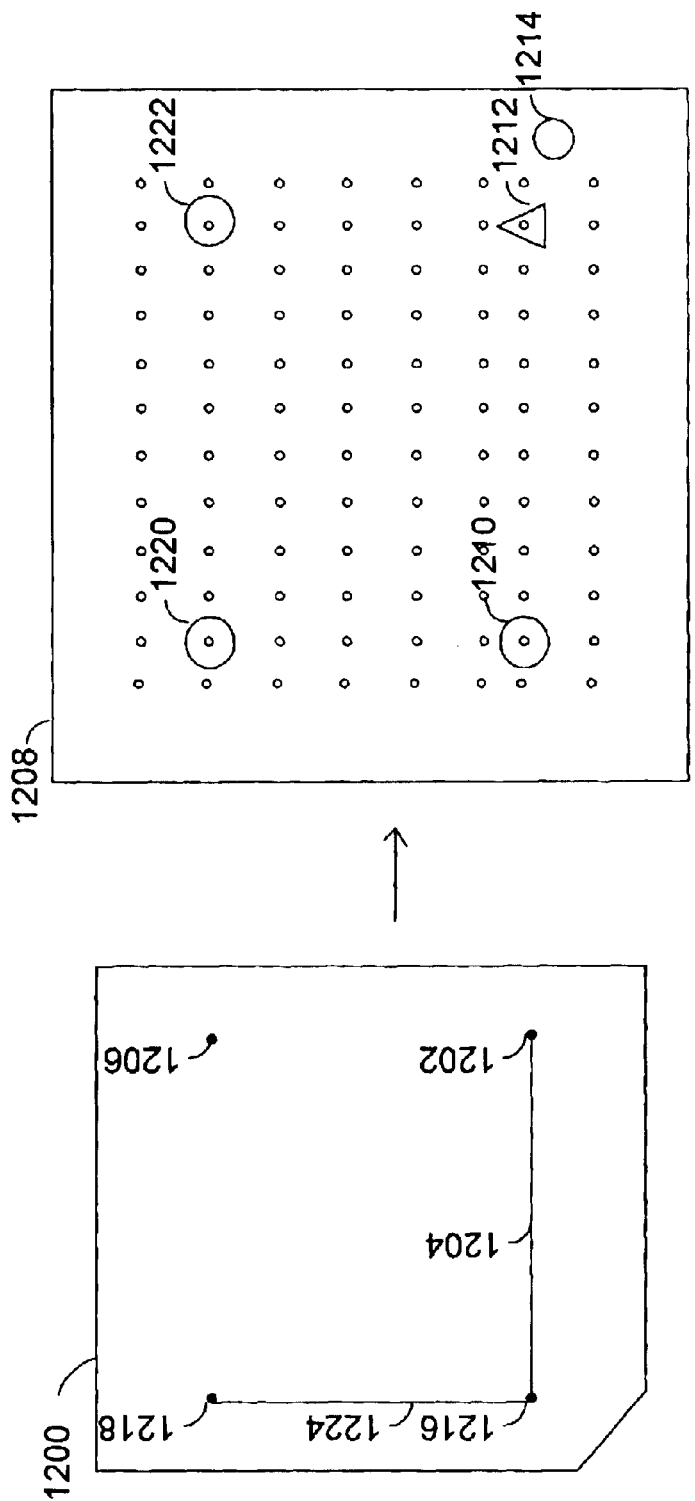
FIG. 12 is a mechanical drawing of a socket, a light source, and a packaged IC viewed from the top.

FIG. 12 is a mechanical drawing of a socket, 1208, a light source, 1214, and a packaged IC, 1200, viewed from the top. In this embodiment, the light source, 1214, is physically mounted to the top of the socket, 1208. Socket hole 1212 is electrically connected to one lead of light source 1214 and a positive voltage is electrically connected to the other lead of light source 1214. Socket holes, 1210, 1220, and 1222, in this example, are connected to an external ground.

Pin 1202 is electrically connected through ground path 1204 to pin 1216 and pin 1216 is electrically connected through ground path 1224 to pin 1218. Pin 1206 on packaged IC 1200 is not connected to a ground or a voltage reference. When packaged IC 1200 is incorrectly inserted into socket 1208, in this example, pin 1216 is inserted in to socket hole 1210, pin 1202 is inserted into socket hole 1212, pin 1218 is inserted into socket hole 1220, and pin 1206 is inserted into socket hole 1222. When packaged IC 1200 is incorrectly inserted into socket 1208, in this example, a ground path is provided from socket hole 1212 to a ground. An activated light source, 1214, in this example, indicates the packaged IC, 1200, is oriented incorrectly.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A system for indicating orientation of a packaged IC comprising:
   a) a socket;
   b) a light source, the light source physically and electrically connected to the socket;
   c) wherein the light source is activated when the packaged IC is correctly inserted in the socket.

2. A system for indicating orientation of a packaged IC comprising:
   a) a socket;
   b) a light source, the light source physically and electrically connected to the socket;
   c) wherein the light source is activated when the packaged IC is incorrectly inserted in the socket.

3. A system for indicating orientation of a packaged IC comprising:
   a) a socket;
   b) a light source, the light source physically mounted to the socket and electrically connected between a first socket hole and a second socket hole on the socket;
   c) wherein the light source is activated when the packaged IC is correctly inserted in the socket.

4. A system for indicating orientation of a packaged IC comprising:
   a) a socket;
   b) a light source, the light source physically mounted to the socket and electrically connected between a first socket hole and a second socket hole on the socket;
   c) wherein the light source is activated when the packaged IC is incorrectly inserted in the socket.

5. A system for indicating orientation of a packaged IC comprising:
   a) a socket;
   b) a light source, the light source physically mounted to the socket and electrically connected between a first socket hole and second socket hole on the socket;
   c) wherein the first socket hole is connected to a positive voltage, d) wherein the second socket hole is connected to a ground path on the packaged IC when the packaged IC is oriented correctly;

e) wherein the light source is activated when the packaged IC is oriented correctly.

6. The system in claim 5 wherein the light source is an LED.

7. The system in claim 5 wherein the socket is a ZIF socket.

8. A system for indicating orientation of a packaged IC comprising:

a) a socket;

b) a light source, the light source physically mounted to the socket and electrically connected between a first socket hole and second socket hole on the socket;

c) wherein the first socket hole is connected to a positive voltage;

d) wherein the second socket hole is connected to a ground path on the packaged IC when the packaged IC is oriented incorrectly;

e) wherein the light source is activated when the packaged IC is oriented incorrectly.

9. The system in claim 8 wherein the light source is an LED.

10. The system in claim 8 wherein the socket is a ZIF socket.

11. A method for indicating orientation of a packaged IC comprising:

a) physically mounting a light source to a socket;

b) electrically connecting the light source between a first socket hole and a second socket hole on the socket;

c) inserting the packaged IC in the socket;

d) providing a positive voltage to the first socket hole;

e) wherein the second socket hole is connected to a ground path on the packaged IC when the packaged IC is oriented correctly;

f) wherein the light source is activated when the packaged IC is oriented correctly.

12. The method in claim 11 wherein the light source is an LED.

13. The method in claim 11 wherein the socket is a ZIF socket.

14. A method for indicating orientation of a packaged IC comprising:

a) physically mounting a light source to a socket;

b) electrically connecting the light source between a first socket hole and a second socket hole on the socket;

c) inserting the packaged IC in the socket;

d) providing a positive voltage to the first socket hole;

e) wherein the second socket hole is connected to a ground path on the packaged IC when the packaged IC is oriented incorrectly;

f) wherein the light source is activated when the packaged IC is oriented incorrectly.

15. The method in claim 14 wherein the light source is an LED.

16. The method in claim 14 wherein the socket is a ZIF socket.

17. A system for indicating orientation of a packaged IC comprising:

a) a means for creating light, the means for creating light physically and electrically connected to a means for containing the packaged IC;

b) wherein the means for creating light is activated by the packaged IC when the packaged IC is correctly placed in the means for containing the packaged IC.

* * * * *